(12) United States Patent
Kim

(10) Patent No.: US 9,019,003 B2
(45) Date of Patent: Apr. 28, 2015

(54) VOLTAGE GENERATION CIRCUIT

(71) Applicant: SK Hynix Inc., Icheon-si, Gyeonggi-do (KR)

(72) Inventor: Hyun Sik Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/958,034

(22) Filed: Aug. 2, 2013

(65) Prior Publication Data

US 2014/0159792 A1   Jun. 12, 2014

(30) Foreign Application Priority Data

Dec. 11, 2012 (KR) .................. 10-2012-0143585

(51) Int. Cl.
*H02M 3/07* (2006.01)
*G11C 7/12* (2006.01)

(52) U.S. Cl.
CPC .. *G11C 7/12* (2013.01); *H02M 3/07* (2013.01)

(58) Field of Classification Search
CPC ........................................ G11C 5/145
USPC ............................. 327/536; 363/60
See application file for complete search history.

(56) References Cited

U.S. PATENT DOCUMENTS

| | | | | |
|---|---|---|---|---|
| 5,952,872 A * | 9/1999 | Hur | | 327/535 |
| 6,097,662 A * | 8/2000 | Itou | | 365/230.03 |
| 6,472,926 B2 * | 10/2002 | Taito et al. | | 327/536 |
| 6,560,145 B2 * | 5/2003 | Martines et al. | | 365/185.18 |
| 6,724,242 B2 * | 4/2004 | Kim et al. | | 327/536 |
| 6,876,246 B2 * | 4/2005 | Kim | | 327/536 |
| 6,894,554 B2 * | 5/2005 | Ito | | 327/536 |
| 7,253,676 B2 * | 8/2007 | Fukuda et al. | | 327/536 |
| 7,259,612 B2 * | 8/2007 | Saether | | 327/536 |
| 7,652,924 B2 * | 1/2010 | Kawajiri et al. | | 365/185.18 |
| 7,733,162 B2 * | 6/2010 | Kim et al. | | 327/536 |
| 7,742,358 B2 * | 6/2010 | Nakai et al. | | 365/226 |
| 7,755,417 B2 * | 7/2010 | Suzuki | | 327/536 |
| 7,782,120 B2 * | 8/2010 | Kim et al. | | 327/535 |
| 7,944,278 B2 * | 5/2011 | Kim et al. | | 327/536 |
| 7,977,966 B2 * | 7/2011 | Lee et al. | | 326/16 |
| 8,008,964 B1 * | 8/2011 | Cook et al. | | 327/536 |
| 8,111,107 B2 * | 2/2012 | Huang | | 331/17 |
| 8,270,189 B2 * | 9/2012 | Walters | | 363/59 |
| 8,283,971 B2 * | 10/2012 | Shin | | 327/536 |
| 8,633,759 B2 * | 1/2014 | Sung | | 327/536 |
| 2002/0017946 A1 * | 2/2002 | Fujii et al. | | 327/534 |
| 2007/0069804 A1 * | 3/2007 | Kim et al. | | 327/536 |
| 2007/0069805 A1 * | 3/2007 | Choi et al. | | 327/536 |
| 2012/0153986 A1 * | 6/2012 | Kim | | 326/16 |

FOREIGN PATENT DOCUMENTS

KR   1019980037415 A   8/1998
KR   1020120026871 A   3/2012

* cited by examiner

*Primary Examiner* — Thomas J Hiltunen
(74) *Attorney, Agent, or Firm* — William Park & Associates Ltd.

(57) ABSTRACT

A voltage generation circuit includes an oscillator configured to output a first period signal and a second period signal in response to a detection signal; a period signal select unit configured to receive the first and second period signals and output one of the first and second period signals as an additional period signal in response to a control signal; and a charge pump unit configured to charge-pump an input voltage in response to the first period signal and the additional period signal and generate a power supply voltage.

16 Claims, 3 Drawing Sheets

VOLTAGE GENERATION CIRCUIT

CROSS-REFERENCES TO RELATED APPLICATION

The present application claims priority under 35 U.S.C. §119(a) to Korean application number 10-2012-0143585, filed on Dec. 11, 2012, in the Korean Intellectual Property Office, which is incorporated herein by reference in its entirety.

BACKGROUND

1. Technical Field

Various embodiments relate to a semiconductor apparatus, and more particularly, to a voltage generation circuit of a phase change RAM (random access memory).

2. Related Art

In general, the unit cell of a phase change random access memory (PCRAM) is constituted by one switching element connected to a word line, for example, a diode, and a variable resistor (GST: Ge2Sb2Te5) connected to a bit line. The PCRAM can store data in a memory cell by controlling a reversible phase change of the variable resistor (GST). The reversible phase change of the variable resistor (GST) is implemented by Joule heating through the electrical pulse applied from an outside.

FIG. 1 is a circuit diagram of a conventional PCRAM 1.

The PCRAM 1 includes a latch unit 10, a read unit 20, a write unit 30, a global bit line switch 40, and a plurality of bit line switches 50, 51 and 52. FIG. 1 also illustrates the GYSWN, GYSWP, LYSWN and LYSWP signals.

The latch unit 10 exchanges data DQ with the read unit 20 and the write unit 30 in response to a latch activation signal LEN. The latch activation signal LEN is a signal which is activated in response to a write or read command for input and output of the data DQ.

The PCRAM 1 exchanges data with a memory cell through a global bit line GBL and bit lines BL when performing a read or write operation. Therefore, the global bit line switch 40 and the plurality of bit line switches 50, 51 and 52 electrically connect the read unit 20 or the write unit 30 with the memory cell in the read or write operation of the PCRAM 1.

The PCRAM 1 reads or writes the data DQ to and from the memory cell by using different voltages. That is to say, the PCRAM 1 performs the read operation using a voltage level which does not change the phase of the memory cell, and performs the write operation using a voltage level which changes the phase of the memory cell. Since the phase change of the memory cell is generally implemented through Joule heating, a first power supply voltage VPP inputted to the write unit 30 is higher than a second power supply voltage VDD inputted to the read unit 20.

In the case where the PCRAM 1 is driven by a high voltage after being driven by a low voltage, the PCRAM 1 discharges the global bit line GBL and the bit lines BL to secure operational reliability. In general, in the PCRAM 1, a pre-read operation for preventing an unnecessary write operation before a program operation when the write operation is started and a verify-read operation for verifying whether the write operation is precisely performed are performed. Therefore, it is necessary to discharge the global bit line GBL and the bit lines BL before the program operation.

However, a phenomenon occurs, where junction capacitors are formed between the plurality of bit line switches 50, 51 and 52 and the global bit line GBL and the voltage of a node to which the global bit line GBL and the plurality of bit line switches 50, 51 and 52 are connected drops below a discharge voltage. Due to this fact, a phenomenon is likely to occur, in which the first power supply voltage VPP applied to the write unit 30 drops.

SUMMARY

In an embodiment of the present invention, a voltage generation circuit includes: an oscillator configured to output a first period signal and a second period signal in response to a detection signal; a period signal select unit configured to receive the first and second period signals and output one of the first and second period signals as an additional period signal in response to a control signal; and a charge pump unit configured to charge-pump an input voltage in response to the first period signal and the additional period signal and generate a power supply voltage.

In an embodiment of the present invention, a voltage generation circuit includes: an oscillator configured to output a first period signal and a second period signal in response to a detection signal; a control unit configured to output a control signal in response to a power-up signal, a latch activation signal and a pre-read signal; a period signal select unit configured to receive the first and second period signals and output one of the first and second period signals as an additional period signal in response to the control signal; and a charge pump unit configured to charge-pump an input voltage in response to the first period signal and the additional period signal and to generate a power supply voltage.

In an embodiment of the present invention, a voltage generation circuit includes: a detection unit configured to compare a reference voltage and the power supply voltage and generate the detection signal; a control unit configured to output a control signal in response to a power-up signal, a latch activation signal and a pre-read signal; and a charge pump unit configured to charge-pump an input voltage in response to the detection signal and the control signal, and generate a power supply voltage.

BRIEF DESCRIPTION OF THE DRAWINGS

Features, aspects, and embodiments are described in conjunction with the attached drawings, in which.

DETAILED DESCRIPTION

Hereinafter, a voltage generation circuit according to the to present invention will be described below with reference to the accompanying drawings through various embodiments.

Figure 1:
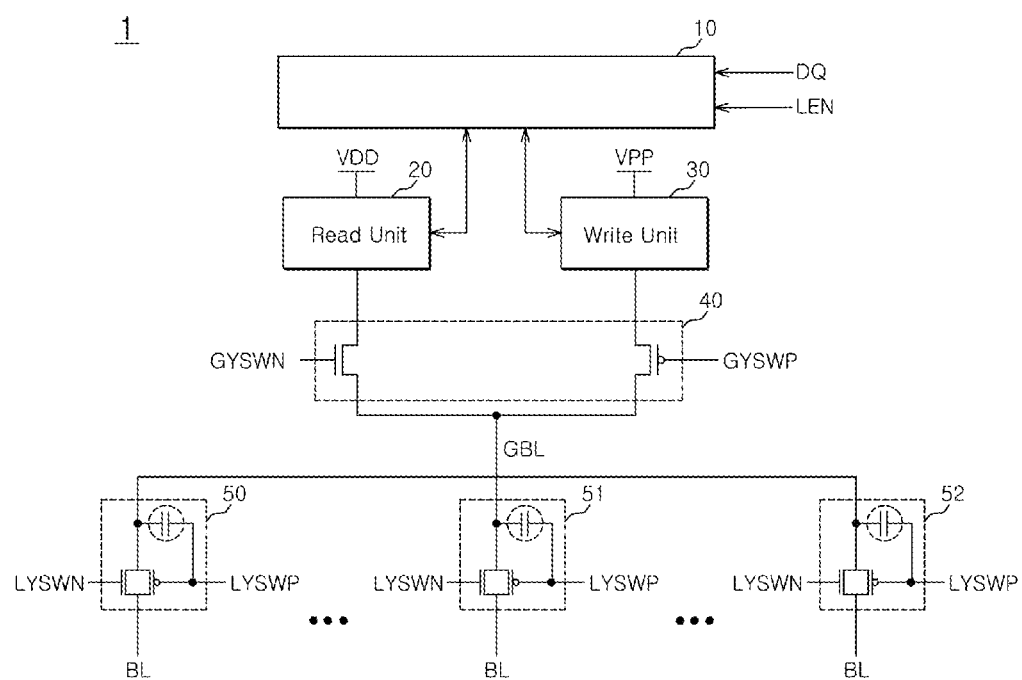
FIG. 1 is a circuit diagram of a conventional PCRAM.
Figure 2:
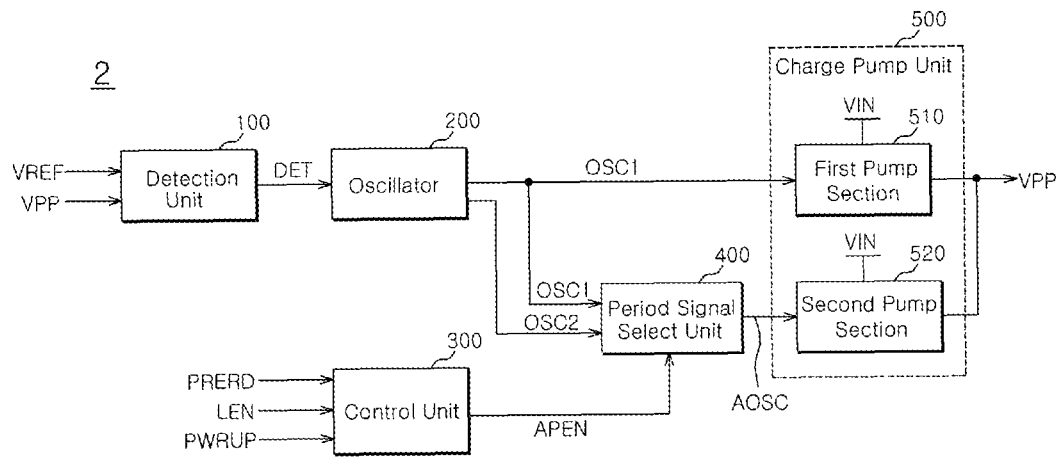
FIG. 2 is a block diagram of a voltage generation circuit in accordance with an embodiment of the present invention.

FIG. 2 is a block diagram of a voltage generation circuit 2 in accordance with an embodiment of the present invention.

The voltage generation circuit 2 may include a detection unit 100, an oscillator 200, a control unit 300, a period signal select unit 400, and a charge pump unit 500. The charge pump unit 500 may include a first pump section 510 and a second pump section 520.

The detection unit 100 may be configured to compare a reference voltage VREF and a power supply voltage VPP and generate a detection signal DET. If the voltage level of the power supply voltage VPP is lower than the voltage level of the reference voltage VREF, the detection signal DET is enabled. The detection signal DET is a signal which is enabled when the voltage level of the power supply voltage VPP is lower than the voltage level of the reference voltage VREF and is changed in its voltage level according to a voltage difference between the reference voltage VREF and the power supply voltage VPP.

For example, the voltage level of the detection signal DET may be higher when a voltage difference between the reference voltage VREF and the power supply voltage VPP is larger than when a voltage difference between the reference voltage VREF and the power supply voltage VPP is small.

The oscillator 200 may be configured to output a plurality of period signals OSC1 and OSC2 in response to the detection signal DET. Additionally, the oscillator 200 sequentially generates a first period signal OSC1 and a second period signal OSC2 according to the voltage level of the detection signal DET which is enabled. The oscillator 200 outputs the first period signal OSC1 when the voltage level of the enabled detection signal DET is under a predetermined voltage level, and additionally outputs the second period signal OSC2 when the voltage level of the enabled detection signal DET is over the predetermined voltage level.

The detection unit 100 and the oscillator 200 may be configured as what is generally known in the art.

The control unit 300 may be configured to generate a control signal APEN in response to a pre-read signal PRERD, a latch activation signal LEN and a power-up signal PWRUP.

The pre-read signal PRERD is a signal which is enabled in a write operation of a PCRAM. A pre-read operation is an operation for reading the data stored in the PCRAM before a program operation to prevent an unnecessary write operation. The pre-read signal PRERD is enabled at the same time a write operation signal is activated.

The power-up signal PWRUP is a signal which is enabled when the PCRAM performs a power-up operation.

The control unit 300 enables the control signal APEN at a time when the pre-read signal PRERD is enabled, and disables the control signal APEN after a predetermined time from when the latch activation signal LEN is enabled.

The period signal select unit 400 may be configured to output an additional period signal AOSC by selecting one signal of the plurality of period signals OSC1 and OSC2 in response to the control signal APEN.

The period signal select unit 400 outputs the additional period signal AOSC by selecting the first period signal OSC1 when the enabled control signal APEN is inputted, and outputs the additional period signal AOSC by selecting the second period signal OSC2 when the disabled control signal APEN is inputted.

The charge pump unit 500 may include a plurality of pump sections 510 and 520. The charge pump unit 500 may be configured to charge-pump an input voltage VIN in response to the first period signal OSC1 and the additional period signal AOSC and output the power supply voltage VPP.

The first pump section 510 may be configured to charge-pump the input voltage VIN in response to the first period signal OSC1 and output the power supply voltage VPP. The second pump section 520 may be configured to charge-pump the input voltage VIN in response to the additional period signal AOSC and output the power supply voltage VPP.

If the period signal select unit 400 outputs the first period signal OSC1 as the additional period signal AOSC, the first period signal OSC1 is inputted to the first pump section 510 and the second pump section 520. At this time, the first pump section 510 and the second pump section 520 simultaneously operate and quickly raise the voltage level of the power supply voltage VPP.

Conversely, if the period signal select unit 400 outputs the second period signal OSC2 as the additional period signal AOSC, the first pump section 510 charge-pumps the input voltage VIN in response to the first period signal OSC1 and outputs the power supply voltage VPP, and the second pump section 520 charge-pumps the input voltage VIN in response to the second period signal OSC2 and outputs the power supply voltage VPP. Since the second period signal OSC2 is a signal which is additionally outputted after the first period signal OSC1 is outputted, the charge pump unit 500 sequentially operates the first pump section 510 and the second pump section 520.

Figure 3:
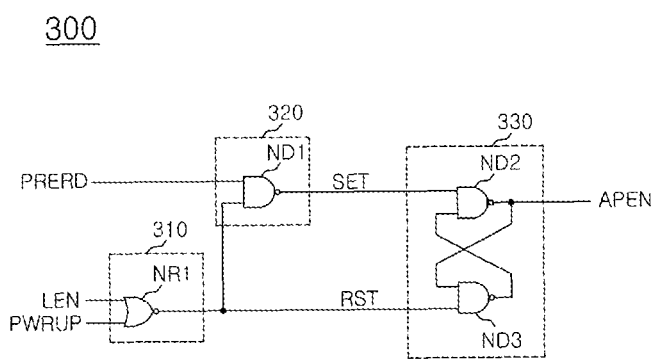
FIG. 3 is a circuit diagram of the control unit of FIG. 2.

FIG. 3 is a circuit diagram of the control unit 300 of FIG. 2.

The control unit 300 may include a reset signal output section 310, a set signal output section 320, and a latch section 330.

The reset signal output section 310 may be configured to output a reset signal RST in response to the latch activation signal LEN and the power-up signal PWRUP.

The reset signal output section 310 may be a first NOR gate NR1 which NORs the latch activation signal LEN and the power-up signal PWRUP and outputs the reset signal RST.

Additionally, the reset signal output section 310 enables the reset signal RST when the latch activation signal LEN and the power-up signal PWRUP are disabled and disables the reset signal RST when any one signal of the latch activation signal LEN and the power-up signal PWRUP is enabled.

In other words, the reset signal output section 310 outputs the reset signal RST at a logic high level when the latch activation signal LEN and the power-up signal PWRUP are inputted at logic low levels, and outputs the reset signal RST at a logic low level when any one of the latch activation signal LEN and the power-up signal PWRUP is inputted at a logic high level.

The set signal output section 320 may be configured to output a set signal SET in response to the reset signal RST and the pre-read signal PRERD.

The set signal output section 320 may be a first NAND gate ND1 which NANDs the reset signal RST and the pre-read signal PRERD and outputs the set signal SET.

Additionally, the set signal output section 320 disables the set signal SET when the reset signal RST and the pre-read signal PRERD are enabled, and enables the set signal SET when any one signal of the reset signal RST and the pre-read signal PRERD is disabled.

In other words, the set signal output section 320 outputs the set signal SET at a logic low level when the reset signal RST and the pre-read signal PRERD are inputted at logic high levels, and outputs the set signal SET at a logic high level when any one signal of the reset signal RST and the pre-read signal PRERD is inputted at a logic low level.

The latch section 330 may be configured to output the control signal APEN in response to the set signal SET and the reset signal RST. The latch section 330 may be an S-R latch circuit including a second NAND gate ND2 which NANDs the set signal SET and the output signal of a third NAND gate ND3 and outputs the control signal APEN and the third NAND gate ND3 which NANDs the control signal APEN and the reset signal RST and outputs the output is signal.

The latch section 330 enables the control signal APEN when the disabled set signal SET and the enabled reset signal RST are inputted, and disables the control signal APEN after a predetermined time from when the enabled set signal SET and the disabled reset signal RST are inputted.

In other words, the latch section 330 transitions the control signal APEN to a logic high level when the set signal SET of the logic low level and the reset signal RST of the logic high level are inputted, and transitions the control signal APEN to a logic low level after the predetermined time from when the set signal SET of the logic high level and the reset signal RST of the logic low level are inputted. The predetermined time may be the signal processing time of the latch section 330.

Operations of the control unit 300 according to the enable timings of the power-up signal PWRUP, the pre-read signal PRERD and the latch activation signal LEN will be described below.

First, if the enabled power-up signal PWRUP is inputted to the control unit 300, the reset signal RST is disabled and the set signal SET is enabled. At this time, the control signal APEN is disabled.

Namely, if the power-up signal PWRUP with the logic high level is inputted to the control unit 300, the reset signal RST becomes the logic low level and the set signal SET becomes the logic high level. At this time, the control signal APEN becomes the logic low level.

Next, when the disabled power-up signal PWRUP is inputted, the control unit 300 operates as follows.

First, when the write operation of the PCRAM is activated, the pre-read signal PRERD is enabled at the same time the write operation is activated. After the pre-read signal PRERD is enabled, the latch activation signal LEN is enabled to receive and output data from and to an outside.

If the pre-read signal PRERD is enabled, the control unit 300 enables the control signal APEN. While the control unit 300 retains the enable period of the control signal APEN before the latch activation signal LEN is enabled, if the latch activation signal LEN is enabled, the control unit 300 disables the control signal APEN after the predetermined time.

That is to say, if the pre-read signal PRERD transitions to the logic high level, the control unit 300 transitions the control signal APEN to the logic high level. While the control unit 300 retains the logic high period of the control signal APEN before the latch activation signal LEN transitions to the logic high level, if the latch activation signal LEN transitions to the logic high level, the control unit 300 transitions the control signal APEN to the logic low level after the to predetermined time.

Figure 4:
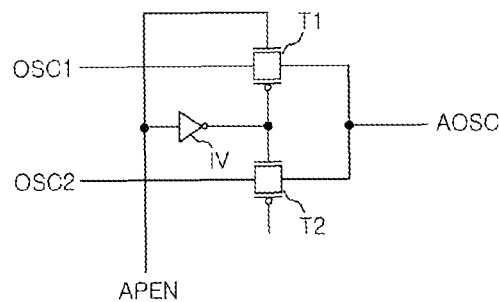
FIG. 4 is a circuit diagram of the period signal select unit of FIG. 2.

FIG. 4 is a circuit diagram of the period signal select unit 400 of FIG. 2.

The period signal select unit 400 may include an inverter IV which inverts the control signal APEN, a first switch T1 which determines whether to output the first period signal OSC1 as the additional period signal AOSC, in response to the output signal of the inverter IV and the control signal APEN, and a second switch T2 which determines whether to output the second period signal OSC2 as the additional period signal AOSC, in response to the output signal of the inverter IV and the control signal APEN.

If the enabled control signal APEN is inputted to the period signal select unit 400, the first switch T1 outputs the first period signal OSC1 as the additional period signal AOSC. Conversely, if the disabled control signal APEN is inputted to the period signal select unit 400, the second switch T2 outputs the second period signal OSC2 as the additional period signal AOSC.

If the control signal APEN with the logic high level is inputted to the period signal select unit 400, the first switch T1 is open and the second switch T2 is closed, and the first period signal OSC1 is outputted as the additional period signal AOSC. Conversely, if the control signal APEN with the logic low level is inputted to the period signal select unit 400, the first switch T1 is closed and the second switch T2 is open, and the second period signal OSC2 is outputted as the additional period signal AOSC.

Figure 5:
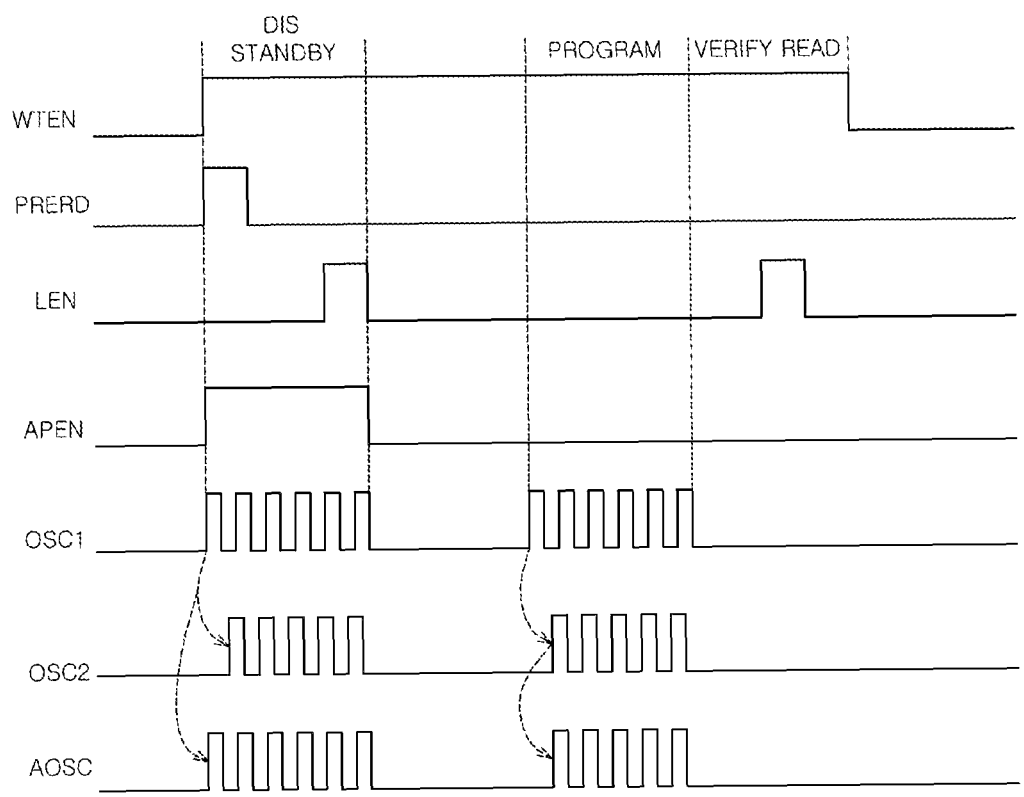
FIG. 5 is an operation timing diagram of the voltage generation circuit in accordance with the embodiments of the present invention.

FIG. 5 is an operation timing diagram of the voltage generation circuit 2 in accordance with the embodiments of the present invention.

Operation timings of the voltage generation circuit 2 in accordance with the embodiments of the present invention will be described below with reference to FIGS. 2 to 5.

If a write activation signal WTEN is enabled to a logic high level, the pre-read signal PRERD is enabled. The PCRAM performs a read operation in response to the pre-read signal PRERD. Afterwards, in order to perform the program operation using a write unit of the PCRAM, a global bit line (GBL) should be discharged. At this time, the charge pump unit 500 simultaneously operates the first pump section 510 and the second pump section 520, and prevents the voltage level of the power supply voltage VPP from dropping due to a junction capacitor between the global bit line (GBL) and a local bit line switch.

To this end, the voltage generation circuit 2 enables the control signal APEN when the pre-read signal PRERD is enabled, and outputs the first period signal OSC1 as the additional period signal AOSC through the period signal select unit 400. Next, if the latch activation signal LEN is enabled, the control signal APEN is disabled after the predetermined time. A period in which the control signal APEN is enabled corresponds to a global bit line discharge period DIS in the write operation and a standby period STANDBY. In other words, the control signal APEN is a signal which is enabled when performing a discharge operation of the global bit line (GBL).

During a program operation period PROGRAM in which the PCRAM performs the program operation, the control signal APEN of the voltage generation circuit 2 is disabled, and the second period signal OSC2 is outputted as the additional period signal AOSC. Finally, in a verify-read operation period VERIFY READ, since the PCRAM has performed the program operation at a voltage higher than a voltage used in the read operation, the global bit line (GBL) is not discharged.

As is apparent from the above descriptions, in the voltage generation circuit in accordance with the embodiments of the present invention, a stable voltage is generated when performing a discharge operation and a write operation for a global bit line, whereby it is possible to improve the reliability of a PCRAM.

While various embodiments have been described above, it will be understood to those skilled in the art that the embodiments described are by way of example only. Accordingly, the voltage generation circuit described herein should not be limited based on the described embodiments. Rather, the voltage generation circuit described herein should only be limited in light of the claims that follow when taken in conjunction with the above description and accompanying drawings.

What is claimed is:

1. A voltage generation circuit comprising:
an oscillator configured to output a first period signal and a second period signal in response to a detection signal;
a period signal select unit configured to receive the first and second period signals and output one of the first and second period signals as an additional period signal in response to a control signal;
a first pump section configured to charge-pump an input voltage in response to the first period signal and output a power supply voltage;

a second pump section configured to charge-pump the input voltage in response to the additional period signal and output the power supply voltage; and a detection unit configured to compare a reference voltage and the power supply voltage and generate the detection signal, wherein the detection signal is enabled when a voltage level of the power supply voltage is lower than a voltage level of the reference voltage, and a voltage level of the detection signal is changed in relation to a voltage difference between the reference voltage and the power supply voltage, and wherein the oscillator outputs the first period signal when a voltage level of the enabled detection signal is under a predetermined voltage level, and additionally outputs the second period signal when a voltage level of the enabled detection signal is over the predetermined voltage level.

2. The voltage generation circuit according to claim 1, wherein the control signal is enabled when performing a discharge operation of a global bit line.

3. The voltage generation circuit according to claim 1, wherein the oscillator sequentially generates the first period signal and the second period signal according to the voltage level of the enabled detection signal.

4. The voltage generation circuit according to claim 1, wherein:
the control signal is enabled when performing a discharge operation of a global bit line; and
the period signal select unit outputs the first period signal as the additional period signal when the control signal is enabled, and outputs the second period signal as the additional period signal when the control signal is disabled.

5. The voltage generation circuit according to claim 1, wherein:
when the control signal is enabled the first pump section and the second pump section simultaneously operate to raise a voltage level of the power supply voltage; and
when the control signal is disabled the charge pump unit sequentially operates the first pump section and the second pump section.

6. A voltage generation circuit comprising:
an oscillator configured to output a first period signal and a second period signal in response to a detection signal;
a control unit configured to output a control signal in response to a power-up signal, a latch activation signal and a pre-read signal;
a period signal select unit configured to receive the first and second period signals and output one of the first and second period signals as an additional period signal in response to the control signal; and
a charge pump unit configured to charge-pump an input voltage in response to the first period signal and the additional period signal and generate a power supply voltage.

7. The voltage generation circuit according to claim 6, wherein the control unit comprises:

a reset signal output section configured to output a reset signal in response to the power-up signal and the latch activation signal;
a set signal output section configured to output a set signal in response to the reset signal and the pre-read signal; and
a latch section configured to output the control signal in response to the reset signal and the set signal.

8. The voltage generation circuit according to claim 6, wherein the control unit enables the control signal when the pre-read signal is enabled, and disables the control signal after a predetermined time from when the latch activation signal is enabled.

9. The voltage generation circuit according to claim 6, wherein the control unit disables the control signal when the power-up signal is enabled, regardless of whether the pre-read signal and the latch activation signal are enabled.

10. The voltage generation circuit according to claim 6, further comprising:
a detection unit configured to compare a reference voltage and the power supply voltage and generate the detection signal.

11. The voltage generation circuit according to claim 10, wherein the detection signal is enabled when a voltage level of the power supply voltage is lower than a voltage level of the reference voltage, and a voltage level of the detection signal is changed in relation to a voltage difference between the reference voltage and the power supply voltage.

12. The voltage generation circuit according to claim 11, wherein the oscillator sequentially generates the first period signal and the second period signal according to the voltage level of the enabled detection signal.

13. The voltage generation circuit according to claim 11, wherein the oscillator outputs the first period signal when a voltage level of the enabled detection signal is under a predetermined voltage level, and additionally outputs the second period signal when a voltage level of the enabled detection signal is over the predetermined voltage level.

14. The voltage generation circuit according to claim 13, wherein the period signal select unit outputs the first period signal as the additional period signal when the control signal is enabled, and outputs the second period signal as the additional period signal when the control signal is disabled.

15. The voltage generation circuit according to claim 14, wherein the charge pump unit comprises:
a first pump section configured to charge-pump the input voltage in response to the first period signal and output the power supply voltage; and
a second pump section configured to charge-pump the input voltage in response to the additional period signal and output the power supply voltage.

16. The voltage generation circuit according to claim 15, wherein:
when the control signal is enabled the first pump section and the second pump section simultaneously operate to raise a voltage level of the power supply voltage; and
when the control signal is disabled the charge pump unit sequentially operates the first pump section and the second pump section.

* * * * *